United States Patent
Fujita et al.

(10) Patent No.: US 9,961,816 B2
(45) Date of Patent: May 1, 2018

(54) ELECTRONIC APPARATUS ASSEMBLY MACHINE AND SIMILAR ASSEMBLY MACHINE

(71) Applicant: FUJI MACHINE MFG. CO., LTD., Chiryu (JP)

(72) Inventors: Masatoshi Fujita, Anjyo (JP); Seigo Kodama, Ama-gun (JP)

(73) Assignee: FUJI MACHINE MFG. CO., LTD., Chiryu (JP)

(*) Notice: Subject to any disclaimer, the term of this patent is extended or adjusted under 35 U.S.C. 154(b) by 151 days.

(21) Appl. No.: 14/787,546

(22) PCT Filed: Jun. 7, 2013

(86) PCT No.: PCT/JP2013/065865
§ 371 (c)(1),
(2) Date: Oct. 28, 2015

(87) PCT Pub. No.: WO2014/196081
PCT Pub. Date: Dec. 11, 2014

(65) Prior Publication Data
US 2016/0183419 A1    Jun. 23, 2016

(51) Int. Cl.
*H05K 13/04* (2006.01)

(52) U.S. Cl.
CPC ..... *H05K 13/0452* (2013.01); *H05K 13/0404* (2013.01)

(58) Field of Classification Search
CPC ........... B25J 13/00; B25J 13/08; G25B 15/02; H01L 21/67; H01L 21/677; H05K 13/0404; H05K 13/0452
See application file for complete search history.

(56) References Cited

U.S. PATENT DOCUMENTS

| | | |
|---|---|---|
| 5,743,005 A | 4/1998 | Nakao et al. |
| 5,889,925 A | 3/1999 | Tsurutani et al. |

(Continued)

FOREIGN PATENT DOCUMENTS

| | | |
|---|---|---|
| CN | 101072495 A | 11/2007 |
| JP | 6 8078 | 1/1994 |

(Continued)

OTHER PUBLICATIONS

Extended European Search Report dated May 17, 2016 in Patent Application No. 13886315.4.

(Continued)

*Primary Examiner* — Carl Arbes
(74) *Attorney, Agent, or Firm* — Oblon, McClelland, Maier & Neustadt, L.L.P.

(57) ABSTRACT

A mounting device, which receives electronic circuit components from component supply devices, and mounts the components onto a substrate which is carried into a work region by a substrate conveyance device. The mounting device includes (a) a plurality of articulated robots, which include an arm section that includes a plurality of link members, which are connected so as to be relatively rotatable with respect to one another at a plurality of joints, and a hand that is attached to a free end section of the arm section so as to be relatively rotatable, and (b) a robot guide rail that supports base end sections of the articulated robots in a manner in which the articulated robots are capable of moving in a direction that is parallel to a conveyance direction, and the hand holds a rotating head, which holds a plurality of suction nozzles.

15 Claims, 7 Drawing Sheets

(56) References Cited

U.S. PATENT DOCUMENTS

| | | | | |
|---|---|---|---|---|
| 5,993,144 | A * | 11/1999 | Inoue | B21D 43/18 294/65 |
| 6,610,150 | B1 * | 8/2003 | Savage | C23C 16/54 118/719 |
| 2004/0117983 | A1 * | 6/2004 | Beck | H05K 13/0061 29/832 |
| 2006/0085973 | A1 * | 4/2006 | Kodama | H05K 13/04 29/740 |
| 2006/0179645 | A1 * | 8/2006 | Chikuma | H05K 13/08 29/740 |
| 2006/0207090 | A1 * | 9/2006 | Kawada | H05K 13/0408 29/832 |
| 2007/0089113 | A1 * | 4/2007 | Kobayashi | H01L 23/544 718/103 |
| 2011/0289772 | A1 * | 12/2011 | Kosaka | H05K 13/0452 29/832 |
| 2013/0041492 | A1 * | 2/2013 | Kodama | H05K 13/08 700/95 |
| 2013/0046402 | A1 * | 2/2013 | Kodama | H05K 13/04 700/117 |

FOREIGN PATENT DOCUMENTS

| | | |
|---|---|---|
| JP | 7 116984 | 5/1995 |
| JP | 7 77313 | 8/1995 |
| JP | 9 319425 | 12/1997 |
| JP | 2007098553 A * | 4/2007 |
| JP | 2010 263069 | 11/2010 |
| JP | 2011 23684 | 2/2011 |
| JP | 2011 210960 | 10/2011 |
| JP | 2012 238691 | 12/2012 |

OTHER PUBLICATIONS

International Search Report dated Aug. 20, 2013 in PCT/JP13/065865 Filed Jun. 7, 2013.

Office Action dated Nov. 22, 2016 in Japanese Patent Application No. 2015-521254 (submitting unedited computer generated English translation only).

European Search Report dated Dec. 18, 2017 in European Application No. 13 886 315.4 (5 pages).

Chinese Office Action dated Nov. 29, 2017 in Chinese Application No. 201380077168.6 (with English Translation), 17 pages).

* cited by examiner

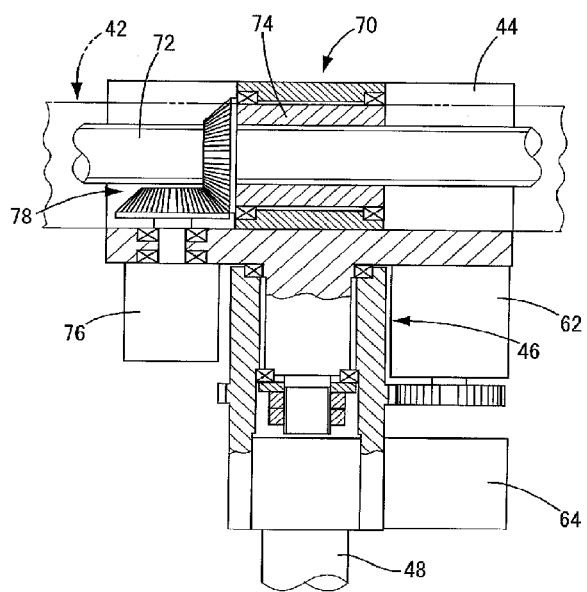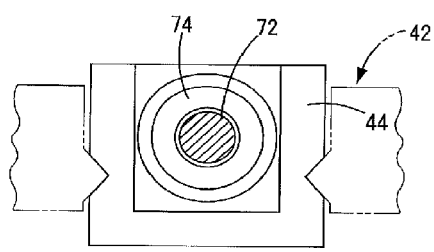
FIG. 3a
FIG. 3b

ELECTRONIC APPARATUS ASSEMBLY MACHINE AND SIMILAR ASSEMBLY MACHINE

TECHNICAL FIELD

The present disclosure relates to an electronic apparatus assembly machine that is provided with an articulated robot, which includes an arm section that includes a plurality of link members, which are connected so as to be relatively rotatable with respect to one another at a plurality of joints, and a hand that is attached to a free end section of the arm section so as to be relatively rotatable and a similar assembly machine thereto.

BACKGROUND ART

Articulated robots are widely used in assembly lines that assemble large apparatuses such as automobile assembly lines, but in electronic-circuit-component mounting machines, for example, an XY robot is used in the manner disclosed in PTL 1. Electronic-circuit-component mounting machines are generally machines that assemble electronic circuits by mounting a plurality of electronic circuit components, which are supplied from a plurality of component supply devices, onto a circuit board that is carried into a work region by a substrate conveyance device, but since high accuracy is required in the positioning of the electronic circuit components on the circuit board, XY robots that can easily secure high positioning accuracy are used.

CITATION LIST

Patent Literature

PTL 1: JP-A-2010-263069

In contrast to this, in electronic-circuit-component mounting machines, in recent years, in addition to mounting electronic circuit components on flat plate circuit boards only, the mounting of various components (generically referred to as electronic apparatus components) including electronic circuit components on three dimensionally-shaped substrates has also been required, and in addition, a high assembly work efficiency has been required. In order to satisfy this requirement, in addition to increasing the degrees of freedom of the motion of the hand, it is effective to arrange a plurality of robots in a mounting region of electronic apparatus components onto a single substrate, and for example, configure so that assembly work is performed as a result of a plurality of robots cooperating so that a robot performs mounting of an electronic apparatus component onto the substrate while another robot is performing retrieval of an electronic apparatus component from a component supply device. However, in the configuration of XY robots, it is difficult to increase the degrees of freedom of motion of the hand, and in addition, since it is difficult to cause regions in which movement of the hand is possible to mutually overlap between a plurality of robots, it is difficult to cause a plurality of robots to perform a cooperation action.

The above-mentioned problem was described with respect to electronic apparatus assembly machines, but the same circumstances apply to assembly machines such as assembly machines of small mechanical devices such as bearings and reduction gears, and gear devices of analog timepieces, in which the same level of hand positioning accuracy as electronic apparatus assembly machine is required.

SUMMARY

Problem to be Solved

In view of the above-mentioned circumstances, the present disclosure was devised as a solution that achieves an improvement in at least one of the motion freedom and the working capacity of a hand in an electronic apparatus assembly machine or a similar assembly machine thereto.

Solution to Problem

The above-mentioned technical problem is solved by configuring an assembly machine including (a) a main body frame, (b) a substrate conveyance device that is supported by the main body frame, and conveys a substrate in a conveyance direction, (c) a plurality of component supply devices that are supported by the main body frame lined up in a direction that is parallel to the conveyance direction, and respectively supply a single kind of component, (d) a work device that performs work that includes at least mounting work, which receives the components from the component supply devices, and mounts the components onto the substrate that is carried into the work region by the substrate conveyance device, and (e) a control device that controls at least the work device, in which the assembly machine assembles a target device by mounting a plurality of the components, which are supplied from the plurality of component supply devices, onto the substrate that is carried into a work region by the substrate conveyance device, such that the work device includes an articulated robot, which includes an arm section that includes a plurality of link members, which are connected so as to be relatively rotatable with respect to one another at a plurality of joints, and a hand that is attached to a free end section of the arm section so as to be relatively rotatable.

The above-mentioned technical problem is also solved by configuring an electronic apparatus assembly machine including (a) a main body frame, (b) a substrate conveyance device that is supported by the main body frame, and conveys a substrate in a conveyance direction, (c) a plurality of component supply devices that are supported by the main body frame lined up in a direction that is parallel to the conveyance direction, and respectively supply a single kind of electronic circuit component, (d) a work device that performs work that includes at least mounting work, which receives the electronic circuit components from the component supply devices, and mounts the electronic circuit components onto the substrate that is carried into the work region by the substrate conveyance device, and (e) a control device that controls at least the work device, in which the electronic apparatus assembly machine assembles an electronic apparatus by mounting a plurality of the electronic circuit components, which are supplied from the plurality of component supply devices, onto the substrate that is carried into a work region by the substrate conveyance device, such that the work device includes an articulated robot, which includes (1) an arm section that includes a plurality of link members, which are connected so as to be relatively rotatable with respect to one another at a plurality of joints, and (2) a hand that is attached to a free end section of the arm section so as to be relatively rotatable.

The electronic apparatus includes an electronic circuit, which includes at least a circuit substrate, and an electronic circuit component that is mounted thereon, and furthermore, may include at least one of an operation device, a notification device that uses images or sounds and a casing.

The hand of the articulated robot can be configured to hold one or more of various work tools such as a "component holder that holds electronic circuit components by receiving electronic circuit components from a component supply device in order to mount the electronic circuit components on a circuit substrate", a "screw tightening tool", a "laser welding tool", a "soldering tool", a "creamy solder applicator", an "adhesive applicator", or a "caulking tool", and in a case in which a plurality of the articulated robots are provided, it is possible to configure so that the work tools that are held by the plurality of hands of the plurality of articulated robots perform assembly work by cooperating with one another.

Advantageous Effects

In the above-mentioned assembly machine, since the work device includes the articulated robot, which includes the arm section, and the hand that is attached to the free end section of the arm section, it is easy to increase the degrees of freedom of motion of the hand, and in addition, in a case in which a plurality of robots are provided, since it is easy to cause regions in which the hands of the plurality of robots can move to overlap with one another, it is easy to cause the plurality of robots to perform a cooperation action. There are cases in which these advantages more than make up for the disadvantage of it being difficult to increase the positioning accuracy of the hand, in such a case, the present invention disclosure is particularly effective. In particular, if the assembly machine is configured to include robot support rail that supports a base end section of the articulated robot in a manner in which the articulated robot is capable of moving in a direction that is parallel to a conveyance direction of the substrate by the substrate conveyance device, it is possible to easily change the configuration of the assembly machine to match the dimensions and configuration of a target device to be assembled. This effect is also obtained in a case in which the position of the base end section is, for example, changed manually during a set-up change or the like, but if the assembly machine is configured to be capable of moving using a robot movement device that is provided with a driving source, changes in configuration are further facilitated. In addition, since the articulated robot has a large degree of freedom of motion, it is possible to cause the hand to perform work while following the movement of the substrate without moving the base end section, but if the assembly machine is configured to include a robot movement device that is provided with a driving source, control of the articulated robot in order to perform work while following is facilitated, and in addition, a range in which it is possible to perform work while following is increased.

Since the work device also includes an articulated robot in the above-mentioned electronic apparatus assembly machine, the same effect as that mentioned in relation to the above-mentioned assembly machine can be obtained.

BRIEF DESCRIPTION OF DRAWINGS

FIG. 3 is a view that shows a base end section of the articulated robot in an enlarged manner, FIG. 3a is a partial cross-sectional front view, and FIG. 3b is a lateral view of a main part.

FIG. 4 is a view that shows a free end section of the articulated robot in an enlarged manner.

FIG. 6 is a view that shows an imaging device of FIG. 5 in an enlarged manner.

DESCRIPTION OF EMBODIMENTS

Hereinafter, an electronic-circuit-component mounting machine will be described with reference to the drawings as an example of an electric apparatus assembly machine, which is an embodiment of the present disclosure. Additionally, in addition to the following embodiments, the present disclosure can be implemented as aspects in which various modifications have been carried out on the basis of the knowledge of a person skilled in the art.

Figure 1:
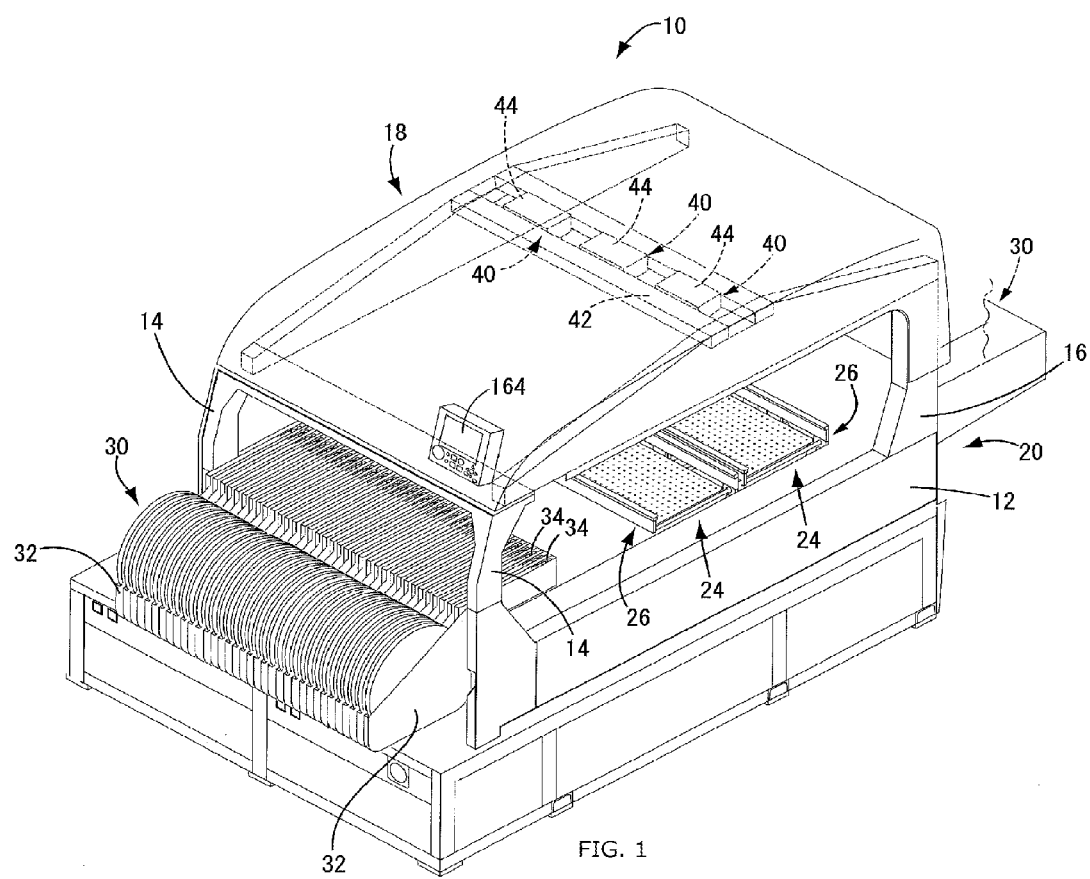
FIG. 1 is a perspective view that shows an electronic-circuit-component mounting machine, which is an embodiment of the present disclosure.

An electronic-circuit-component mounting machine 10 is shown in FIG. 1. Hereinafter, the electronic-circuit-component mounting machine 10 will be abbreviated to the mounting machine 10, but the mounting machine 10 can be used individually, and in addition, can configure an electronic circuit assembly system by being installed side by side with other pair circuit board work machines such as another one or more mounting machines, a screen printer, a reflow furnace or the like.

The mounting machine 10 includes a mounting machine main body 20, which is provided with a bed 12, a front column 14, a rear column 16 and a crown 18, and one or more lanes (two lanes in the present embodiment) of aboard conveyance holding device 24 are provided on the bed 12. Since the board conveyance holding device 24 is a well-known device, detailed description thereof has been omitted, but is provided with a belt conveyor 26 that supports a circuit board from below and conveys the circuit board, and a board holding device 28 (refer to FIG. 5) that fixes and holds a circuit board that is conveyed by the belt conveyor 26 at one or more mounting positions (two in the present embodiment). A component supply device 30 is arranged on at least one side of the board conveyance holding device 24 (both sides in the present embodiment). The component supply device 30 that is illustrated is configured by a plurality of tape feeders 32. The tape feeders 32 supply a taped component one at a time, which is held on a holding tape in a manner in which one type of electronic circuit component can be extracted, from a component supply section 34 by feeding the taped component intermittently at a single pitch. As the component supply device 30, it is possible to use various well-known feeders such as a bulk component feeder, a tray feeder or a stick feeder, and it is possible to arrange mutually different kinds of feeder on one side or both sides of the board conveyance holding device 24. The two-lane board conveyance holding device 24 can use various aspects. For example, it is possible to configure the board conveyance holding device 24 in which the conveyance directions are the same, and it is possible to configure so that one lane comes to a halt and holds a circuit board while the other lane conveys a circuit board, and so that the conveyance directions are opposite and one lane returns a circuit board, and the like.

Figure 2:
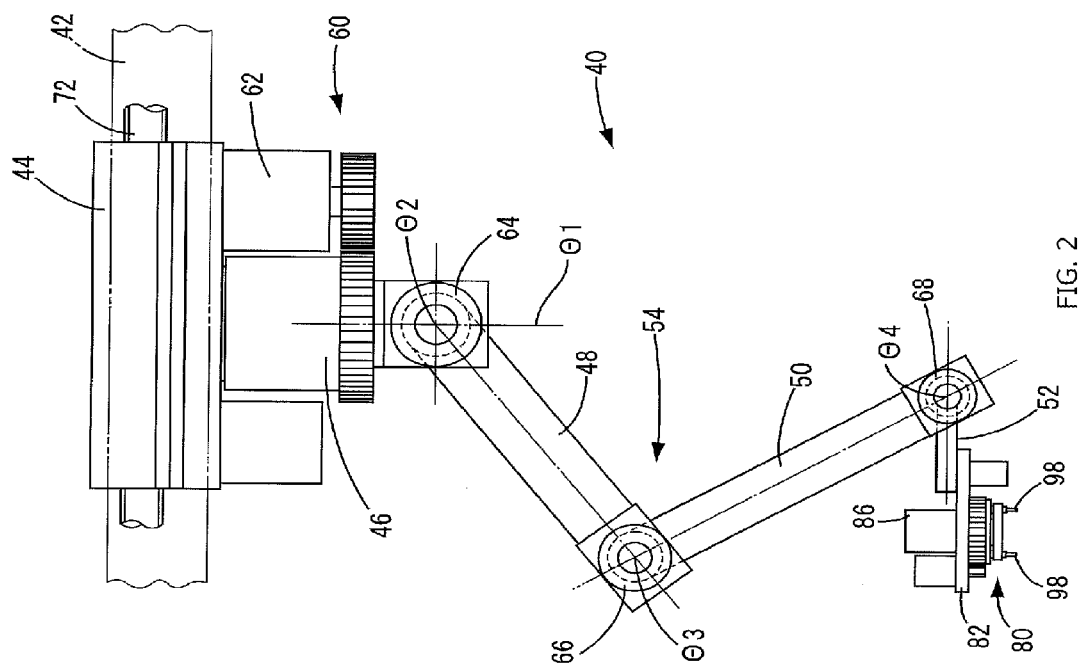
FIG. 2 is a front view that shows a single articulated robot of the electronic-circuit-component mounting machine in a state in which an arm section is revolved by 90° from a reference position.

In FIG. 1, the illustration of the entire crown 18 has been omitted, but one or more articulated robots 40 (three in the present embodiment) are arranged in a state of facing the board conveyance holding device 24. One of the articulated robots 40 is extracted and shown in FIG. 2. The articulated robot 40 (hereinafter, referred to as the robot 40) is held by a robot guide rail 42 (hereinafter, referred to as the guide rail 42), which is formed inside the crown 18, in a manner in which the articulated robot 40 is capable of moving in a direction that is parallel to the conveyance direction of the belt conveyor 26. The robot 40 is provided with a base platform 44 that is held by the guide rail 42, a rotating body 46 that is held by the base platform 44 in a manner in which the rotating body 46 is capable of rotating about a vertical rotational axis line, a first arm 48 that is connected to the rotating body 46 in a manner in which the first arm 48 is capable of rotating about a horizontal rotational axis line, a second arm 50 that is connected to the first arm 48 in a manner in which the second arm 50 is capable of rotating about a horizontal rotational axis line, and a hand 52 that is connected to the second arm 50 in a manner in which the hand 52 is capable of rotating about a horizontal rotational axis line. An arm section 54 is configured by the first arm 48 and the second arm 50, and a base end section of the arm section 54 is held by the base platform 44 through the rotating body 46 in a manner in which the arm section 54 is capable of revolving about a vertical axis, the hand 52 is held by a free end section of the arm section 54 in a manner in which the hand 52 is capable of rotating about a horizontal rotational axis line, and the hand 52 can be inclined at an arbitrary angle in an arbitrary direction with respect to a horizontal surface as a result of a combination of revolution of the arm section 54 about the vertical axis and rotation about the horizontal axis line with respect to the arm section 54. In addition, as a result of a combination of the revolution of the arm section 54 and rotation of the first arm 48 and the second arm, the hand 52 can move to an arbitrary position within a horizontal plane, and can move in a vertical direction, and therefore, can move to an arbitrary position in a three dimensional space.

A robot driving device 60 is provided in order to move the hand 52 in the above-mentioned manner. The robot driving device 60 is provided with rotation driving devices 62, 64, 66 and 68 that are respectively provided between the base platform 44 and the rotating body 46, between the rotating body 46 and the first arm 48, between the first arm 48 and the second arm 50, and between the second arm and the hand 52. Each rotation driving device 62, 64, 66 and 68 is respectively provided with an electric motor, and an encoder that detects a rotational position of the electric motor. The encoder may be an incremental type, but an absolute type is desirable. In addition, a robot position change device 70 is provided in order to move the base platform 44 along the robot guide rail 42. As shown in FIG. 3, along the guide rail 42, the robot position change device 70 is provided with a male screw member 72, which is provided so as to be incapable of rotation and incapable of movement in an axial direction, a nut 74, which is held by the base platform 44 in a manner in which the nut 74 is capable of rotation but is incapable of movement in the axial direction, a rotation driving device 76 that is held by the base platform 44 in a fixed manner, and a rotation transmission device 78 that transmits the rotation of the rotation driving device 76 to the nut 74. The rotation driving device 76 is provided with an electric motor, and a multirotation absolute encoder that detects a multirotation position of the electric motor.

Figure 4A:
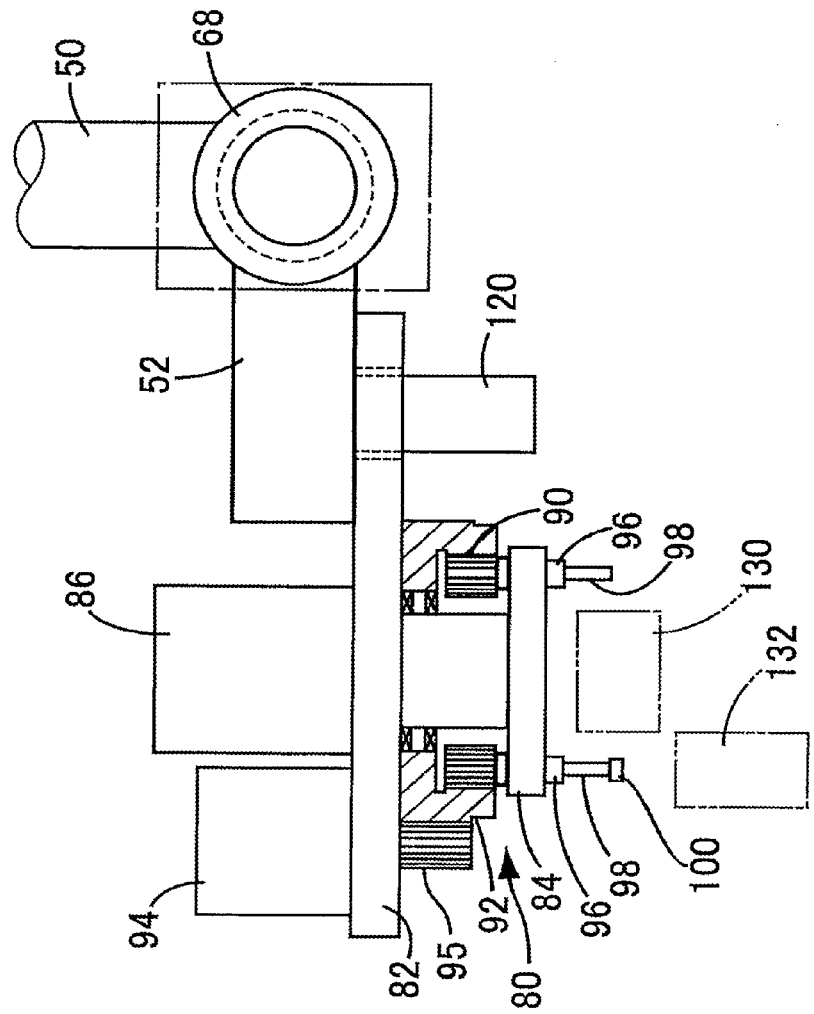
FIG. 4a is a partial cross-sectional front view.
Figure 4B:
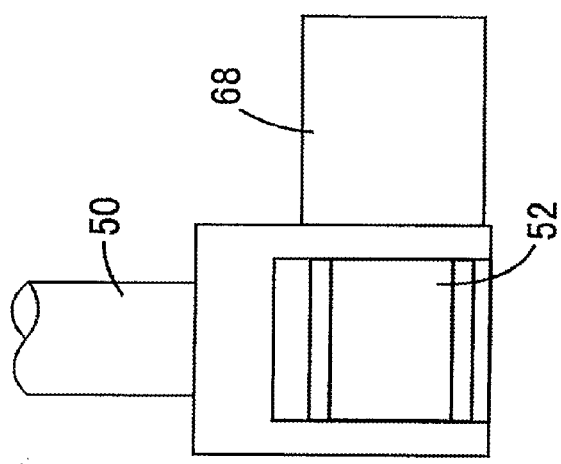
FIG. 4b is a lateral view of a main part.

A rotating head 80 is held by the hand 52. As shown in FIG. 4, the rotating head 80 includes a head main body 82 that is detachable from the hand 52, and a rotating body 84 that is held by the head main body 82 in a manner in which the rotating body 84 is capable of rotation but is incapable of movement in the axial direction, and the rotating body 84 is rotated about perpendicular rotational axis line with respect to the head main body 82 as a result of a rotation driving device 86, which is provided with an encoder and an electric motor. A plurality of pinions 90 (12 in the example that is illustrated) are held on a single circumference, the center of which is a rotational axis line of the rotating body 84 at equal angular intervals, in a manner in which each of the pinions 90 is capable of rotation, but incapable of movement in an axial direction, and the pinions 90 engage with an annular gear 92 that is provided so as to be capable of rotation with respect to the head main body 82 but incapable of movement in the axial direction. The annular gear 92 is rotated by a rotation driving device 94 that is fixed to the head main body 82, and a pinion 95, and the plurality of pinions 90 are rotated at once. The rotation driving device 94 is also provided with an electric motor, and an encoder.

A nozzle holding member 96 is respectively held by each of the pinions 90 in a manner in which the nozzle holding members 96 are incapable of relative rotation, but are capable of relative movement in the axial direction. A rotational axis line of each nozzle holding portion 96 is parallel to a rotational axis line of the rotating body 84, and is elevated and lowered in an axial direction with respect to the pinions 90 by an actuator (an air cylinder in the present embodiment), which is not illustrated. Each nozzle holding member 96 respectively holds a suction nozzle 98 in a manner in which the suction nozzle 98 is detachable and is incapable of relative rotation, is normally held in an elevated position, which is a retreat position, by biasing device (for example, a compression coil spring) which are not illustrated, and is lowered to an advanced position as a result of positive pressure air being supplied to the air cylinder. Furthermore, in addition to a positive pressure supply pathway to the above-mentioned air cylinder, negative pressure and positive pressure supply pathways, which are not illustrated, are connected to the nozzle holding members 96, and negative pressure and positive pressure are selectively supplied to the suction nozzles 98 that are held by the nozzle holding members 96. The suction nozzles 98 perform vacuum holding of an electronic circuit component 100 (hereinafter referred to as a component 100) as a result of the supply of negative pressure, and the component 100 is released as a result of the supply of positive pressure.

Figure 5:
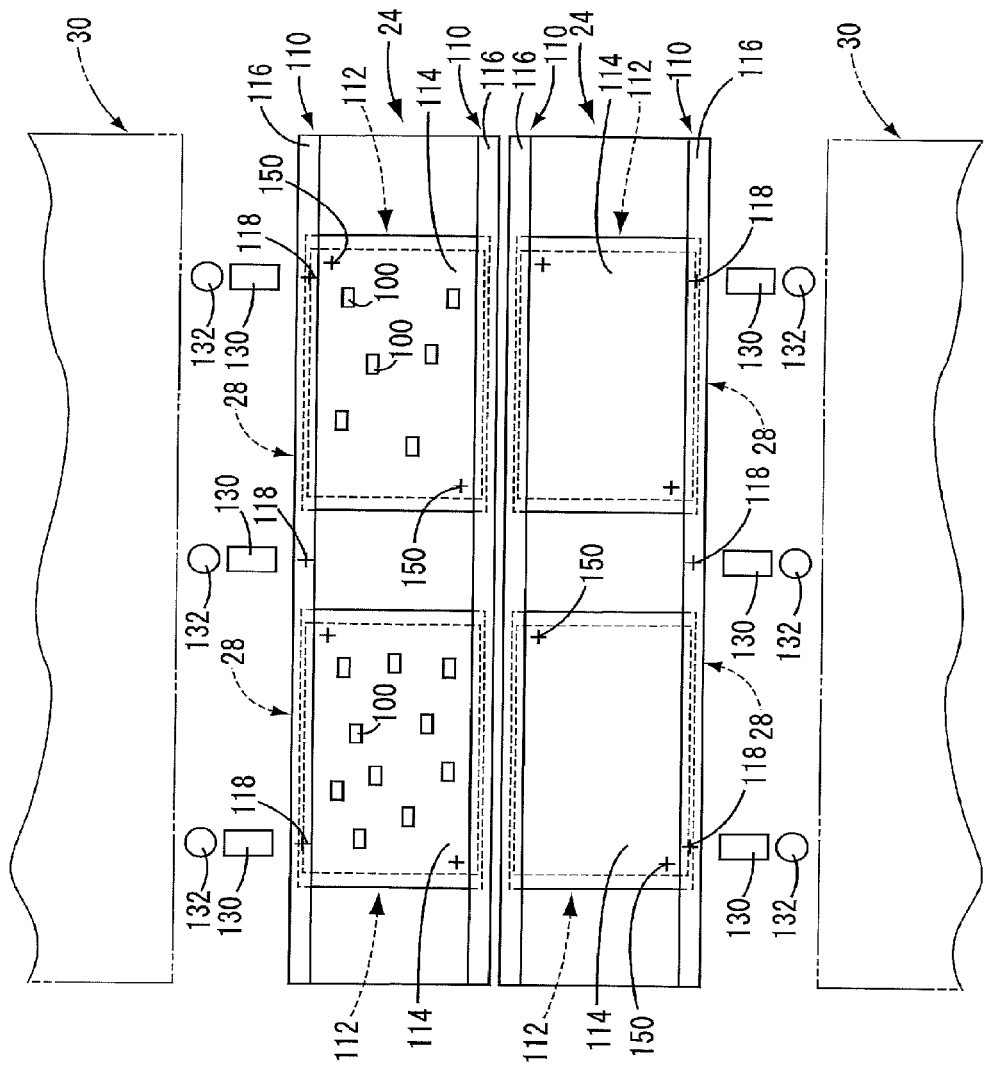
FIG. 5 is a schematic plan view that shows an arrangement of various devices on a bed of the electronic-circuit-component mounting machine of FIG. 1.
Figure 6B:
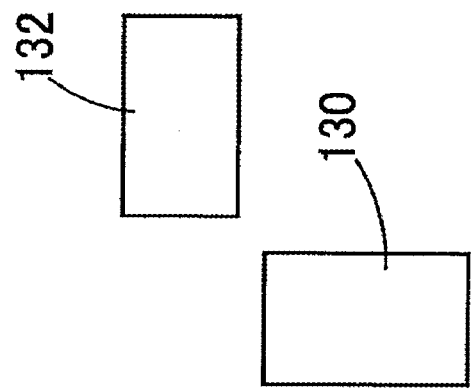
FIG. 6b is a lateral view.
Figure 6A:
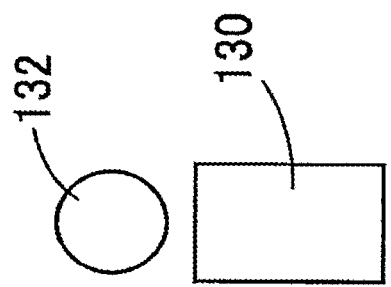
FIG. 6a is a plan view.

In the above-mentioned manner, the two lane board conveyance holding device 24 is arranged on the bed 12 of the mounting machine main body 20, and the component supply device 30 is arranged on both sides of the board conveyance holding device 24. A schematic status thereof is shown in FIG. 5, but two board pushing-up devices 112 are provided for each of the lane of the two lane board conveyance holding device 24. The board pushing-up devices 112 push up a circuit board 114 that is conveyed to a predetermined position by the belt conveyor 26, collectively fix and hold the circuit board 114 with a reception members 116 that are provided on an upper end of a board guide rail 110, and together with the reception members 116 configure the board holding device 28. Further, among the four reception members 116, a plurality of fiducial marks 118 (three each, a total of six in the present embodiment) are provided on the upper faces of two reception member 116 that are most distant from one another. The fiducial marks 118 are imaged by an imaging device 120 (refer to FIG. 4) that is fixed to the hand 52 pointing downward. The use of imaging results will be described later. In addition, two imaging devices 130 and 132 are respectively provided at each of three positions separated in the conveyance direction between each board conveyance holding device 24 and each component supply device 30 in order to detect a height position and a holding position error of a bottom face of the component 100 that is held by the suction nozzles 98 of the rotating head 80. The use of these imaging devices will be described later.

As is evident from the aforementioned description, the robot 40 is a serial link type robot in which there are four control axes. Hereinafter, control of the robot 40 will be described.

Mounting work of the component 100 by the present mounting machine 10 is performed by moving the rotating head 80 using the robot 40 in a state in which the rotational axis line of the rotating head 80 is retained as vertical. Firstly, the rotating head 80 is moved so that one of the suction nozzles 98 is positioned at a component supply section of the component supply device 30 by which a component 100 to be mounted is supplied, for example, above the component supply section 34 of the tape feeder 32, the component 100 is held by the suction nozzle 98, and the component 100 is held by a plurality (preferably all) of the suction nozzles 98 as a result of movement and intermittent repetition of rotation of the rotating head 80. Next, the rotating head 80 is moved so that each suction nozzle 98 is positioned above a mounting position of each component 100 on the circuit board 114 that is held by the board conveyance holding device 24, and the components 100 are mounted to those positions. Mounting work by a single robot 40 on a single circuit board 114 is completed by repeating this series of mounting actions a number of times of the components 100 to be mounted. In the present embodiment, three robots 40 collectively perform mounting work on the two circuit boards 114 that are respectively fixed by the two board holding devices 28 that are mutually separated in the conveyance direction of the board conveyance holding device 24. Various forms of this collective are possible, but in this instance, for example, a robot 40 that is positioned on an upstream side in the conveyance direction (abbreviated to an upstream side robot 40) performs mounting work on a circuit board 114 that is fixed and held by a board holding device 28 that is on the upstream side (abbreviated to an upstream side board 114), a robot 40 that is positioned on a downstream side (abbreviated to a downstream side robot 40) performs mounting work on a circuit board 114 that is held by a board holding device 28 that is on the downstream side (abbreviated to a downstream side board 114), and a robot 40 that is positioned in the middle (abbreviated to a middle robot 40) performs mounting work on both the upstream side board 114 and the downstream side board 114.

Figure 7:
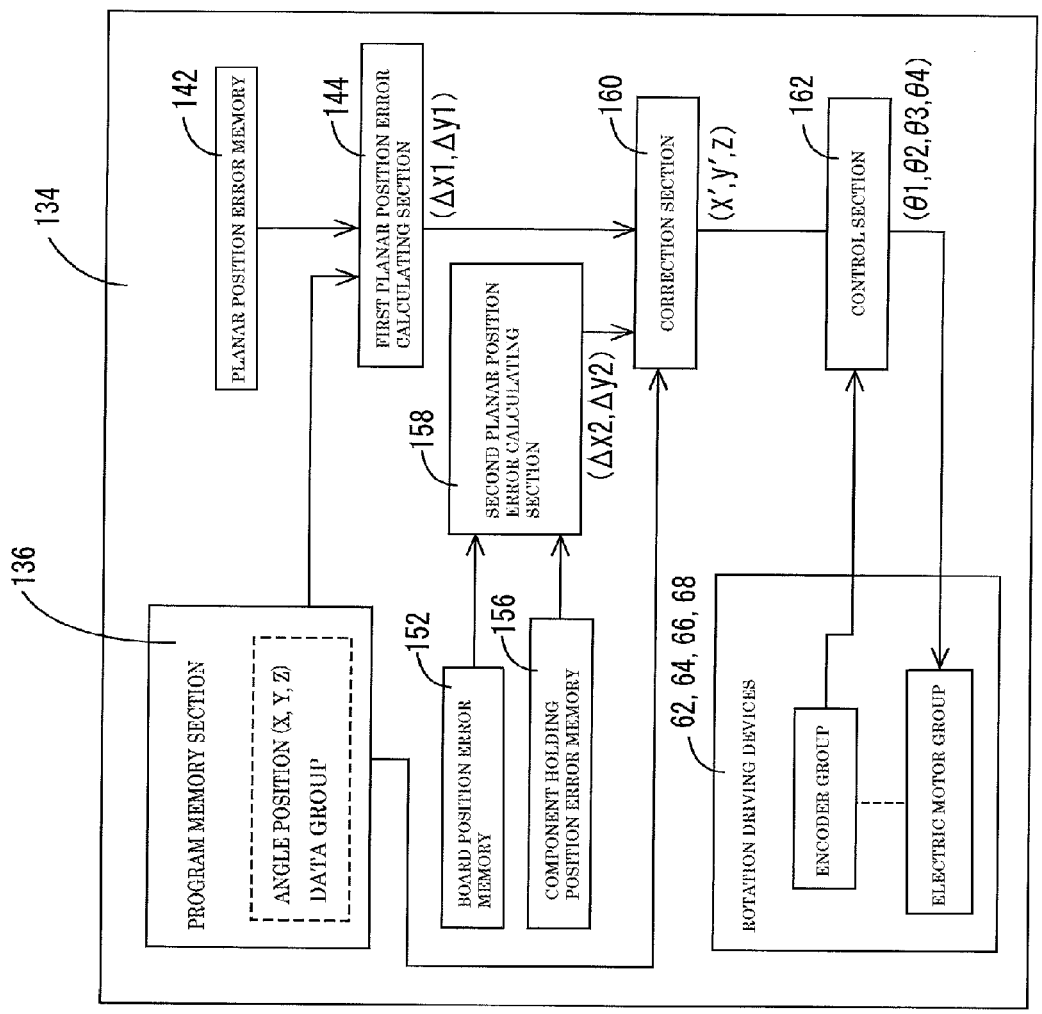
FIG. 7 is a block diagram that shows a portion which controls a single articulated robot in a control device of the electronic-circuit-component mounting machine.

The movement of the rotating head 80 in the mounting work is realized as a result of the actions of each robot 40 being controlled by each control device 134. A single control device 134 is shown in a representative manner in FIG. 7, but this shows a portion, among the control devices of the mounting machine 10, that is related to the control of a single robot 40 only. While the robot 40, which is an articulated type, has an advantage of having a large degree of freedom of action in comparison with publicly-known XY robots of the related art, the robot 40 has a disadvantage of it being difficult to obtain positioning accuracy of the rotating head 80. Therefore, before the initiation of mounting work, preparation work is performed in order to improve the positioning accuracy of the hand 52 of the articulated robot 40. While instructions of the position of the hand 52 are given with a coordinate value (x, y, z) of a three dimensional orthogonal coordinate system (an X, Y, Z coordinate system), the control of the robot 40 is performed with instructions of angle positions (θ1, θ2, θ3 and θ4) of four control axes (θ1, θ2, θ3 and θ4). That is, a program for controlling the robot 40 is stored in a program memory section 136, but positional data, which is stored in the program memory section 136, for moving the hand 52 to each member reception position and each member mounting position, is an aggregate of coordinate values (x, y, z) of the three dimensional orthogonal coordinate system, and during practical mounting work, it is necessary to use the positional data by converting corrected coordinate values (x', y', z'), in which the above-mentioned coordinate values (x, y, z) have been corrected in order to move the hand 52 to precise positions, into angle position instruction values (θ1, θ2, θ3 and θ4). Before mounting work, preparation work that acquires the corrected coordinate values (x', y', z') is performed.

The preparation work is performed for each of the three robots 40, but, among the six fiducial marks 118, the preparation work of the upstream side robot 40 and the downstream side robot 40 is respectively performed using four fiducial marks 118 that are positioned on each of the upstream side and the downstream side, and in addition, the preparation work of the middle robot 40 is performed using four fiducial marks 118 that are positioned on either the upstream side or the downstream side. More specifically, in order to sequentially move the imaging device 120 that is fixed to the hand 52 to positions that exactly face the four fiducial marks 118, the robot 40 is controlled while converting a control program, which is created in advance (created as an aggregate of coordinate values of the three dimensional orthogonal coordinate system), into angle positions (θ1, θ2, θ3 and θ4), and positional shifts of images of the fiducial marks 118 that are acquired by the imaging device 120 at each of the four positions are respectively stored in a planar position error memory 142 as positioning errors of the hand 52 at each position. As a result of the above-mentioned preparation work being performed by sequentially moving the three robots 40 to predetermined positions (positions that correspond to the centers of rectangles that are defined by the above-mentioned four fiducial marks 118) in the conveyance direction of the board conveyance holding device 24, a planar position error is acquired for each of the four fiducial marks 118 for all of the three robots 40, the planar position errors are stored in the planar position error memory 142, and the preparation work is completed.

Further, during the implementation of practical mounting work, the positioning accuracy in the conveyance direction of the base end section of each articulated robot 40 is regarded as sufficiently high, the error is a value that is respectively equivalent to the above-mentioned planar position error at the above-mentioned four positions, is regarded as taking a value on a curved surface that changes smoothly between the four points, the planar position error at each reference position of the hand 52 is calculated by the calculation of a first planar position error calculating section 144, and is supplied to a correction section 160 as a first planar position error ($\Delta x1$, $\Delta y1$).

Additionally, it is possible for the calculation of first planar position error data ($\Delta x1$, $\Delta y1$) at each reference position of the hand 52 to be executed before the initiation of practical mounting work, stored in the first planar position error memory, and supplied to the correction section 160 by being sequentially read out during practical mounting work.

In contrast to this, in addition to it being sufficient for the suction nozzle 98 to obtain the positioning accuracy in a height direction during reception of the component 100 from the component supply device 30, and during mounting of the component 100 to the circuit board 114, the heights at both times are close, and as mentioned above, since relative movement of each nozzle holding member 96 and each pinion 90 is allowed by the biasing device, the correction of a height position error is regarded as being sufficient if performed by mechanical adjustment device such as shim adjustment during assembly of the articulated robot 40 on the base platform 44, and therefore, is not performed in the present embodiment.

However, if necessary, it is also possible to perform the correction of height position error using a method that is based on the correction of the planar position error. That is, the acquisition and storage of four height position errors in the vicinity of the above-mentioned four positions is performed using a method that is similar to the acquisition and storage of the planar position error at the above-mentioned four positions. More specifically, for example, a reference nozzle is held in one of the plurality of nozzle holding members 96 of the rotating head 80, a reference line, which is formed by encompassing an outer peripheral surface of the reference nozzle is imaged by the imaging device 130 that is provided in the vicinity of each of the four fiducial marks 118, a height position error of the reference nozzle that is acquired from the imaging results is regarded as a height position error of the hand 52 and stored in a height position error memory.

Further, the height position error with respect to each reference position of the hand 52 is acquired during the implementation of practical mounting work using a similar method to that of the planar position error, and a control program (created as an aggregate of coordinate values of a three dimensional orthogonal coordinate system) for moving the hand 52 to each reference position is corrected so that both the height position error and the planar position error are corrected.

Correction of the hand 52 planar position error and the height position error that arises as a result of positioning accuracy of the robot 40 being comparatively low has been described above, but in addition to the correction, holding position error of the circuit board 114 by the board conveyance holding device 24 and mounting position error, which arises as a result of the holding position error of the component 100 by the suction nozzles 98, are also acquired, a second planar position error ($\Delta x2$, $\Delta y2$) is calculated in a second planar position error calculating section 158 on the basis of these position errors, and the second planar position error is supplied to the correction section 160. Since the acquisition and the correction of the second planar position error is the same as the acquisition and the correction that is performed in well-known XY robots of the related art, detailed description thereof has been omitted, and only features that are specific to the present embodiment will be described. In the present embodiment, since the three robots 40 are provided in a single mounting machine 10, two fiducial marks 150 that are respectively provided on each of the upstream side board 114 and the downstream side board 114 are imaged by the two robots 40, for example, the upstream side robot 40 and the downstream side robot 40, the holding position error of each circuit board 114 is acquired on the basis of the imaging results and stored in a board position error memory 152 in association with each circuit board. In addition, after the component 100 has been received from the component supply device 30 that is provided on either side of the board conveyance holding device 24, each robot 40 is positioned with respect to the nearest imaging devices 130 and 132 on the basis of a control program that is established in advance, the plurality of suction nozzles 98 are sequentially made to face the imaging devices 130 and 132 by rotating the rotating head 80, a height position of the bottom face of the component 100 that is held by the suction nozzles 98, and a component holding position error (a position error of the center of the component 100) and a rotation posture error (a rotation posture error about the center of the component 100) are acquired, and are stored in a bottom face position memory, which is not illustrated in association with each suction nozzle 98, a component holding position error memory 156 and a component rotation posture error memory, which is not illustrated. Further, during practical mounting, the board position error and the component holding position error are corrected by the correction section 160 together with the positioning error of the hand 52 by the robot 40, corrected planar position coordinate values (x', y') are acquired, these corrected planar position coordinate values and, in the present embodiment, z coordinate values which are not corrected, are converted into angle positions ($\theta1$, $\theta2$, $\theta3$ and $\theta4$) in a control section 162, and control of the robot 40 is performed.

Additionally, the use of the data of the height position of the bottom face of the component 100 and the rotation posture error will be described later.

A current is supplied from the control section 162 to each electric motor of each rotation driving device 62, 64, 66 and 68 of the robot driving device 60 on the basis of the data of the above-mentioned converted angle positions ($\theta1$, $\theta2$, $\theta3$ and $\theta4$), the rotational position of each electric motor is controlled in a manner that rotates to a rotational angle position that corresponds to the angle positions ($\theta1$, $\theta2$, $\theta3$ and $\theta4$), and the hand 52 is moved to a precise reference position by the robot 40. In addition, in the rotating head 80, the rotating body 84 is rotated at a specific angle by the rotation driving device 86, the plurality of nozzle holding members 96 and suction nozzles 98 are sequentially revolved toward a component reception position, lowered, and receive the component 100, and furthermore, in addition to being revolved toward a component mounting position, the annular gear 92 is rotated by the rotation driving device 94 on the basis of the data of the rotation posture error of the component 100, the rotation posture error of the component 100 is corrected as a result of the suction nozzles 98 being rotated via the pinions 90 and the nozzle holding members 96, and the component 100 is mounted with a precise rotation posture.

Additionally, the imaging devices 130 and 132 are also used in the determination of whether or not a holding state of the component 100 by the suction nozzles 98 is correct. In a case in which an image of the component 100 that is acquired by at least one of the imaging devices 130 and 132 differs from a predetermined image by a set amount or more, action of the mounting machine 10 is stopped, and notification of the fact that the holding state of the component 100 by the suction nozzles 98 is abnormal is performed by a display 164 (refer to FIG. 1), but since this feature is the same as a feature in mounting machines that use well-known XY robots of the related art, detailed description thereof is omitted.

The mounting machine 10 has been described as an embodiment of the claimable disclosure, but the claimable disclosure can also be implemented as various aspects other than this.

For example, in the above-mentioned embodiment, the preparation work is performed once only before the initiation of the mounting work under the assumption that the temperatures of the robot 40, the mounting machine main body 20, the board conveyance holding device 24 and the like are maintained at substantially constant temperatures after the execution of the preparation work as a result of the environmental temperature of the mounting machine 10 being maintained at constant temperatures using air conditioning, and the preparation work being performed after the temperature of the mounting machine 10 has reached a regular state following activation of the mounting machine 10 for a fixed time and the like, but in a case in which a temperature change of the robot 40 or the like which cannot be disregarded in accordance with the continuation of the mounting work arises, the stored data of the planar position error memory 142 may be updated as a result of the same work as the preparation work being performed midway through the execution of the mounting work. For example, the stored data of the planar position error memory 142 is updated every time a set period of time elapses, every time a set number of electronic circuit assemblies are completed, every time the temperature of a location with a comparatively large temperature change changes to a set value or the like.

In addition, detection of the planar position error, which is the error in planar positioning of the hand 52 by the robot 40 is performed on the basis of positional shift of the imaging device 120 with respect to four fiducial marks 118, and the acquisition of the planar position error with respect to each of the reference positions on the circuit board 114 (positions at which electrodes of the component 100 coincide with pads of the circuit board 114) is configured to be performed by calculation, but it is possible to configure so that a reference plate on which a lattice grid is formed on the surface thereof is conveyed and held by the board conveyance holding device 24, both lattice points of the reference plate and the fiducial marks 118 are imaged by the imaging device 120, the planar position error of the hand 52 with respect to each lattice point is acquired from the positioning error of the reference plate with respect to the fiducial marks 118 and a positional shift amount of the imaging device 120 with respect to each lattice point, and the planar position error of each reference position is set as equivalent to the planar position error of each lattice point that is close to each of the reference positions.

In addition, it is possible to configure such that an imaging device, which moves together with the hand 52 is changed for an imaging device that images a pad that is formed on the circuit board 114 so that an electrode of the component 100 is soldered, and the action of the robot 40 is controlled so that a relative positional shift between the electrode of the component 100 that constantly changes depending on the movement of the hand 52 and the pad of the circuit board 114 is resolved. If such a configuration is used, even if the temperature of the robot 40 and the like changes in accordance with the continuation of action, it is possible to negate a change in a relative position with respect to a fiducial mark 118 of the hand 52 that follows the temperature changes. This configuration is particularly easy to adopt in cases in which a mounting head is provided with approximately one to three nozzle holding members 96, and the nozzle holding members 96 and the imaging device 120 are arranged in mutually close contact with one another, and preferably in a manner in which the nozzle holding member 96 and the imaging device 120 are incapable of relative movement.

Additionally, in a case in which three or more nozzle holding members 96 are provided, it is possible to provide the nozzle holding members 96 along a single straight line, or along a single arc.

In addition, after the component 100 is mounted to the circuit board 114, the component 100 is imaged by the imaging device 120, a positional shift amount of the electrode of the component 100 and the pad of the circuit board 114 is detected, a positioning error of the hand 52 by the robot 40 is acquired and a similar effect is obtained by correcting the control of the robot 40 for the mounting work with respect to a subsequent circuit board 114.

In the embodiment, the positioning error of the suction nozzles 98 with respect to the hand 52 was disregarded, but in a case in which it is not possible to disregard this error, it is possible to configure so that the action of the rotation driving device 86 of the rotating body 84 is corrected.

In addition, the relative position error of the component supply section of the component supply device 30 and the suction nozzles 98 is not large enough to have a negative effect on the extraction of the component 100, and since the holding position error of the component 100 by the suction nozzles 98 is removed by the correction of the control of the robot 40 during mounting, these errors are configured to be disregarded, but in a case in which it is not possible to disregard the errors, the component supply section 34 may be imaged by the imaging device 120 and the control of the robot 40 during component reception may be corrected on the basis of the imaging results.

In the embodiment, the base platform 44 of the robot 40 is configured to be moved by the robot position change device 70, which is provided with a driving source, but it is possible to configure a robot position change device in which a driving source is not provided and either one of the male screw member 72 and the nut 74 is rotated manually, and furthermore, it is possible to configure a robot position change device in which the male screw member 72 or the like is not provided, an operator moves the robot 40 along the robot guide rail 42 and can fix the robot 40 at a predetermined position using fixing device such as a fixing screw. At such a time, it is possible to fix the base platform 44 in continuous arbitrary positions, and it is also possible to configure so that it is possible to stably fix the base platform 44 at a plurality of predetermined discrete positions only.

In the embodiment, the mounting work is configured to be performed in a stopped state of the base platform 44 of the robot 40 and the circuit board 114, but it is possible to configure so that the mounting work is performed during movement of the circuit board 114. In such a case, it is possible to cause the hand 52 to follow the movement of the circuit board 114 by moving the base platform 44 in synchronization with the movement of the circuit board 114, or to cause the hand 52 of the robot 40 to follow the movement of the circuit board 114 by controlling a synchronization control section without moving the base platform 44. In either case, it is possible to realize following by electrical control only, but in the case of the former, it is desirable that the fiducial marks 150 of the circuit board 114, which are examples of target detection sections, are imaged by the imaging device, which is an example of a detection device that is provided in a manner that is incapable of relative movement with respect to the base platform 44, and the robot position change device 70 is controlled so that the imaging device is maintained at a fixed relative position with respect to the fiducial marks 150.

In addition, in order to make use of the advantages of an articulated robot, it is desirable that a plurality of the robots 40 are provided in the mounting machine 10, but naturally, it is also possible to provide one robot 40 only, and conversely, it is also possible to provide four or more robots 40. In a case in which the installation number of robots 40 is increased, it is effective to provide a plurality of lanes of the robot guide rails that guide the movement of the robots 40.

Even if the robot position change device is provided with an individual driving device, and position change of the articulated robot on the robot guide rail by the driving device is configured to be performed in synchronization with conveyance of the circuit substrate by the circuit substrate conveyance device using electrical device (it is also possible to include optical device), it is possible to configure so that only one of the robot position change device and the circuit substrate conveyance device is provided with a driving device, and so that both devices are moved in synchronization by mechanically connecting the device that is not provided with a driving device to the device that is provided with a driving device. More specifically, for example, an engagement section is provided in the base end section of the articulated robot, a target engagement section is provided in the circuit substrate conveyance device, and the articulated robot is set to a freely movable state and mechanically follows movement of the circuit substrate conveyance device after a control device causes the engagement section to engage with the target engagement section.

In the embodiment, the robot guide rail 42 is provided in the crown 18 of the mounting machine main body 20, and the articulated robot 40 is provided in a suspended state, but in addition to this, or alternatively, in place of this, it is possible to configure so that a robot guide rail is provided on the upper face of the bed 12 parallel to the conveyance direction of the circuit board 114, and the articulated robot is supported by the robot guide rail. If the robot guide rail is provided above and below, it is particularly easy to cause a plurality of articulated robots to pass by one another.

In the embodiment, the articulated robot is configured to be articulated robot that is capable of applying movement in directions that mutually intersect one another and are parallel to three axes that can define positions in a three dimensional space, and rotation about a single axis to the hand, but it is possible to configure an articulated robot to be capable of applying six degrees of freedom of motion of movement in directions that are parallel to three axes, and rotation about the three axes, and in addition, it is also possible to change the number of degrees of freedom and the kinds of combinations of the directions in which the hand can move and the directions in which the hand can be rotated.

In the embodiment, the hand 52 is configured so as to normally maintain a horizontal posture, but it is possible to configure so that the hand 52 is inclined with respect to a horizontal surface, and in such a case, it is also possible to configure so that at least one of an angle and a direction of inclination can be changed in a plurality of ways. If such a configuration is used, in addition to the flat plate circuit board 114, it becomes possible to mount the component 100 on substrates with three dimensional shapes, and in addition, it also becomes possible to engage an engagement hole or a protrusion with a protrusion or an engagement hole that extends in a direction that is perpendicular to amounting surface that is inclined at an arbitrary angle in an arbitrary direction.

In addition, the component holder that receives the electronic circuit component from the component supply device and holds the electronic circuit component in order to mount the electronic circuit component on the circuit substrate is not limited to the suction nozzles, and the component holder can be configured to include a plurality of pawl portions that are capable of relative motion and retain and hold the electronic circuit component. Furthermore, the hand of the articulated robot can be configured to be provided with one or more of various work tools such as a screw tightening tool, a laser welding tool, a soldering tool, a creamy solder applicator, an adhesive applicator, or a caulking tool, and in a case in which a plurality of the articulated robots are provided, it is possible to configure so that the work tools of the plurality of hands of the plurality of articulated robots perform assembly work by cooperating with one another.

An electronic-circuit-component mounting machine that mounts an electronic circuit component on a circuit substrate has been described as an example, but it is possible to apply the claimable disclosure of the present application widely to electronic apparatus assembly machines, and general assembly machines such as assembly machines of small mechanical devices such as bearings and reduction gears, and gear devices of analog timepieces.

REFERENCE SIGNS LIST

10: ELECTRONIC-CIRCUIT-COMPONENT MOUNTING MACHINE (MOUNTING MACHINE), 12: BED, 14: FRONT COLUMN, 16: REAR COLUMN, 18: CROWN, 20: MOUNTING MACHINE MAIN BODY, 24: BOARD CONVEYANCE HOLDING DEVICE, 26: BELT CONVEYOR, 28: BOARD HOLDING DEVICE, 30: COMPONENT SUPPLY DEVICE, 32: TAPE FEEDER, 34: COMPONENT SUPPLY SECTION, 40: ARTICULATED ROBOT (ROBOT), 42: ROBOT GUIDE RAIL (GUIDE RAIL), 44: BASE PLATFORM, 46: ROTATING BODY, 48: FIRST ARM, 50: SECOND ARM, 52: HAND, 54: ARM SECTION, 60: ROBOT DRIVING DEVICE, 62, 64, 66, 68: ROTATION DRIVING DEVICES, 70: ROBOT POSITION CHANGE DEVICE, 72: MALE SCREW MEMBER, 74: NUT, 76: ROTATION DRIVING DEVICE, 78: ROTATION TRANSMISSION DEVICE, 80: ROTATING HEAD, 82: HEAD MAIN BODY, 84: ROTATING BODY, 86: ROTATION DRIVING DEVICE, 90: PINION, 92: ANNULAR GEAR, 94: ROTATION DRIVING DEVICE, 96: NOZZLE HOLDING MEMBER, 98: SUCTION NOZZLE, 100: ELECTRONIC CIRCUIT COMPONENT (COMPONENT), 110: BOARD GUIDE RAIL, 112: BOAR PUSHING-UP DEVICE, 114: CIRCUIT BOARD, 116: RECEPTION MEMBER, 118: FIDUCIAL MARKS, 120, 130, 132: IMAGING DEVICE, 134: CONTROL DEVICE, 136: PROGRAM MEMORY SECTION, 150: OPTICAL ELEMENT

The invention claimed is:

1. An electronic apparatus assembly machine comprising:
a main body frame;
a substrate conveyance device that is supported by the main body frame, and conveys a substrate in a conveyance direction;
a plurality of component supply devices that are supported by the main body frame lined up in a direction that is parallel to the conveyance direction, and respectively supply a single kind of electronic circuit component;

a work device that performs work that includes at least mounting work, which receives the electronic circuit components from the component supply devices, and mounts the electronic circuit components onto the substrate that is carried into the work region by the substrate conveyance device; and a control device that controls at least the work device, wherein the electronic apparatus assembly machine assembles an electronic apparatus by mounting the plurality of electronic circuit components, which are supplied from the plurality of component supply devices, onto the substrate that is carried into a work region by the substrate conveyance device, wherein the work device includes an articulated robot, which includes an arm section that includes a plurality of link members, which are connected so as to be relatively rotatable with respect to one another at a plurality of joints, and a hand that is attached to a free end section of the arm section so as to be relatively rotatable, and wherein the hand of the articulated robot is provided with a plurality of component holders, and is capable of holding an electronic circuit component with each of the plurality of component holders.

2. The electronic apparatus assembly machine according to claim 1, wherein in addition to including a plurality of the articulated robots, the electronic apparatus assembly machine includes a robot guide rail that supports a base end section of the articulated robot in a manner in which the articulated robots are capable of moving in a direction that is parallel to the conveyance direction.

3. The electronic apparatus assembly machine according to claim 2, wherein intervals on the robot guide rail between the plurality of articulated robots can be changed.

4. The electronic apparatus assembly machine according to claim 3, wherein the intervals on robot guide rail between two articulated robots overlap.

5. The electronic apparatus assembly machine according to claim 2, wherein a position on the robot guide rail of the articulated robot can be changed continuously.

6. The electronic apparatus assembly machine according to claim 2, wherein a position on the robot guide rail of the articulated robot can be changed to any one of a plurality of predetermined discrete positions.

7. The electronic apparatus assembly machine according to claim 2, further including a robot position change device that is provided with a driving device, and is capable of changing a position on the robot guide rail of the articulated robot using a driving force.

8. The electronic apparatus assembly machine according to claim 7, wherein the robot position change device changes the position on the robot guide rail of the articulated robot by synchronizing with conveyance of the substrate by the substrate conveyance device, and the work device is capable of working on the substrate in a state in which the substrate is moved by the substrate conveyance device.

9. The electronic apparatus assembly machine according to claim 2, wherein the robot guide rail is provided parallel to the conveyance direction in an upper section of the main body frame, and the articulated robot is supported by the robot guide rail.

10. The electronic apparatus assembly machine according to claim 2, wherein the robot guide rail is provided parallel to the conveyance direction on an upper face of a bed of the main body frame, and the articulated robot is supported by the robot guide rail.

11. The electronic apparatus assembly machine according to claim 1, wherein a position of the hand of the articulated robot changes following conveyance of the substrate using the substrate conveyance device, and the work device is capable of working on the substrate in a state in which the substrate is being moved by the substrate conveyance device.

12. The electronic apparatus assembly machine according to claim 1, wherein the articulated robot is capable of applying motion of six degrees of freedom including movement in directions that are parallel to three axes, which mutually intersect one another and are capable of defining positions in a three dimensional space, and rotation about the three axes, to the hand.

13. The electronic apparatus assembly machine according to claim 1, wherein the hand holds a rotating head, including a head main body, a rotating body that is held by the head main body so as to be capable of rotating about a rotational axis line, a rotating body rotation device that rotates the rotating body about the rotational axis line, a plurality of component holders that are respectively arranged on a single circumference, the center of which is the rotational axis line of the rotating body, so as to be capable of respectively rotating, and a holder rotation device that rotates the plurality of component holders about an axis line of the component holders.

14. An assembly machine comprising:

a main body frame;

a substrate conveyance device that is supported by the main body frame, and conveys a substrate in a conveyance direction;

a plurality of component supply devices that are supported by the main body frame lined up in a direction that is parallel to the conveyance direction, and respectively supply a single kind of component;

a work device that performs work that includes at least mounting work, which receives the components from the component supply devices, and mounts the components onto the substrate that is carried into the work region by the substrate conveyance device; and a control device that controls at least the work device, wherein the assembly machine assembles a target device by mounting a plurality of components, which are supplied from the plurality of component supply devices, onto the substrate that is carried into a work region by the substrate conveyance device, wherein the work device includes an articulated robot, which includes an arm section that includes a plurality of link members, which are connected so as to be relatively rotatable with respect to one another at a plurality of joints, and a hand that is attached to a free end section of the arm section so as to be relatively rotatable, wherein in addition to including a plurality of the articulated robots, the assembly machine includes a robot guide rail that supports base end sections of the plurality of articulated robots in a manner in which the articulated robots are capable of moving in a direction that is parallel to the conveyance direction, and wherein a position on the robot guide rail of the articulated robot can be changed continuously.

15. The assembly machine according to claim 14, wherein a position of the hand of the articulated robot changes following conveyance of the substrate using the substrate conveyance device, and the work device is capable of working on the substrate in a state in which the substrate is moved by the substrate conveyance device.

\* \* \* \* \*